(12) United States Patent
Kim et al.

(10) Patent No.: US 7,074,719 B2
(45) Date of Patent: Jul. 11, 2006

(54) ALD DEPOSITION OF RUTHENIUM

(75) Inventors: Hyungiun Kim, Lagrangeville, NY (US); Stephen M. Rossnagel, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/724,438

(22) Filed: Nov. 28, 2003

(65) Prior Publication Data

US 2005/0118807 A1 Jun. 2, 2005

(51) Int. Cl.
*H01L 21/44* (2006.01)

(52) U.S. Cl. ...................................... 438/687
(58) Field of Classification Search ............... 438/687, 438/681, 3, 612, 722, 151, 238, 396
See application file for complete search history.

(56) References Cited

U.S. PATENT DOCUMENTS

| | | | | |
|---|---|---|---|---|
| 6,010,744 | A * | 1/2000 | Buskirk et al. | 427/81 |
| 6,589,824 | B1 * | 7/2003 | Ohtani et al. | 438/151 |
| 6,664,168 | B1 * | 12/2003 | Andideh et al. | 438/396 |
| 6,696,363 | B1 * | 2/2004 | Lee et al. | 438/681 |
| 6,727,138 | B1 * | 4/2004 | Girardie et al. | 438/238 |
| 6,812,042 | B1 * | 11/2004 | Kim et al. | 438/3 |
| 6,841,044 | B1 * | 1/2005 | Ruzic | 204/192.1 |
| 6,849,122 | B1 * | 2/2005 | Fair | 117/89 |
| 6,878,628 | B1 * | 4/2005 | Sophie et al. | 438/687 |
| 6,887,776 | B1 * | 5/2005 | Shang et al. | 438/612 |
| 6,887,795 | B1 * | 5/2005 | Soininen et al. | 438/722 |
| 2003/0201537 | A1 | 10/2003 | Lane et al. | |
| 2005/0048776 | A1 * | 3/2005 | Papa Rao et al. | 438/687 |

OTHER PUBLICATIONS

U.S. Appl. No. 10/699,226, filed Oct. 31, 2003, Kim et al.
Rossnagel et al.,Plasma-enhanced atomic layer deposition of Ta and Ti for inter-connect diffusion barriers, J. Vac. Sci. Technol. B 18(4), Jul./Aug. 2002.
Kim et al., Growth of cubic-TaN thin films..J.App.Physics, vol. 92, No. 12,2002.
Kim et al., Growth kinetics and initial stage growth during plasma-enhanced Ti atomic layer deposition, J. Vac. Sci. Technol. A 20(3), May/Jun. 2002.
Kim et al., Diffusion barrier properties of transition metal thin films grown by plasma-enhanced atomic layer deposition, J. Vac.Sci.Technol. B 20(4), J/A 2002.

* cited by examiner

*Primary Examiner*—Michael Lebentritt
*Assistant Examiner*—Andre' C. Stevenson
(74) *Attorney, Agent, or Firm*—Daniel P. Morris; David Aker

(57) ABSTRACT

A method to deposit nucleation problem free ruthenium by ALD. The nucleation problem free, relatively smooth ruthenium ALD film is deposited by the use of plasma-enhanced ALD of ruthenium underlay for consequent thermal ruthenium ALD layer. In addition, oxygen or nitrogen plasma treatments of $SiO_2$ or other dielectrics leads to uniform ALD ruthenium deposition. The method has application as a direct plating layer for a copper interconnect or metal gate structure for advanced CMOS devices.

35 Claims, 3 Drawing Sheets

ALD DEPOSITION OF RUTHENIUM

FIELD OF THE INVENTION

This invention relates to electrical interconnection structures. More particularly, it relates to "back end of the line" (BEOL) interconnections in high performance integrated circuits, and to advanced CMOS device fabrication.

BACKGROUND OF THE INVENTION

Electrodeposition of copper is a standard deposition technique used for copper interconnect applications. However, copper cannot be electroplated directly onto diffusion barrier materials without a thin copper seed layer. In current processes, the copper seed layers are deposited by Physical Vapor Deposition (PVD) for this purpose, often by derivative techniques of ionized PVD (I-PVD). However, in future semiconductor generations, a very conformal film deposition in nanoscale, high aspect ratio structures will be required. This may only be achievable only by Atomic Layer Deposition (ALD) techniques. As an alternative, copper electrodeposition can be also done on other low-resistance metal surfaces. The required material properties for this purpose include nobility, formation of soluble or conducting oxides, and insolubility in the copper bath. Preferably, direct plating materials have good diffusion barrier properties as well as good adhesion to dielectrics. A few metal layers have been identified as candidates, which are generally refractory metals such as Ru, Rh, Co, Mo, Cr, and W.

Recently, ruthenium is receiving attention as a directly plateable material due to its good properties as an electrode in DRAM applications, as a metal gate for CMOS applications, and its application as a seed layer for direct plating of copper using an electroplating process.

Ruthenocene (or ruthenium cyclopentadienyl, $Ru(C_5H_5)_2$), otherwise known as $Ru(Cp)_2$, has been used as a metal precursor which is reacted with molecular oxygen to produce ruthenium thin films by ALD. Polycrystalline ruthenium films with quite low resistivity (12–13 $\mu\Omega$cm) were obtained with low impurity levels. However, due to a nucleation problem associated with the metal organic ruthenium precursor, only a very limited, non-uniform deposition occurs on some dielectric surfaces, including silicon dioxide ($SiO_2$). To overcome this problem, the prior art used an in situ grown aluminum oxide ($Al_2O_3$) layer before ALD of ruthenium. There has been no know solution for direct deposition of ruthenium by ALD on $SiO_2$ and other dielectric surfaces. Even for CVD of ruthenium on oxides, it is a common practice to first deposit a ruthenium seed layer by PVD. For the implementation of ruthenium by ALD to device processing, especially for direct plating and metal gate purpose, some way of depositing metallic ruthenium films directly on to dielectrics is essential.

Due to the RC delay in nanoscale integrated circuits, novel low dielectric constant (low k) materials are being introduced. It has been widely known that vapor phase deposition including chemical vapor deposition (CVD) and ALD generally have nucleation problems on these low k dielectrics. However, as the required film thickness of liner materials, including direct plating liners, is getting thinner as the device scaling entering sub-100 nanometer technological node size, a nucleation problem could be a potentially serious matter. Thus, various surface treatment technique to deposit metal thin films on dielectrics without nucleation during the ALD of ruthenium is essential for implementing ALD of metals as direct plating applications, as well as liner applications, in the BEOL area.

In another application of ruthenium ALD, the metal gate process require direct deposition of ruthenium on thin $SiO_2$ or high k materials. Ruthenium has been considered one of candidates for the metal gate of dual gate CMOS devices due to its work function having the proper value.

SUMMARY OF THE INVENTION

It is therefore an aspect of the present invention to provide a method for forming a layer of ruthenium on a substrate which is free of nucleation problems.

It is another object of the present invention to form a layer of ruthenium on a substrate which is has a low concentration of impurities such as oxygen and carbon. A feature of the invention is the elimination of nucleation issue during ruthenium film ALD on dielectric surfaces, such as $SiO_2$. The invention relates to the use of a nucleation aiding layer deposited by plasma-enhanced ALD by using a ruthenium metal organic precursor and atomic hydrogen. Once the underlayer of ruthenium film is formed, thermal ruthenium ALD using molecular oxygen instead of hydrogen plasma is employed to deposit ruthenium with very low impurity levels of carbon or oxygen.

After proper plasma treatment, the ruthenium metal films are deposited on $SiO_2$ without nucleation problems. The various surface treatment techniques, generally using plasma treatment prior to the atomic layer deposition of ruthenium metal on dielectrics, results in ruthenium deposition by ALD which is free of nucleation problems.

Thus, the invention is directed to a method for depositing ruthenium on a substrate, comprising exposing the substrate to a plasma which causes a high concentration of nucleation sites to be formed on the substrate, thus forming an exposed substrate; and depositing ruthenium on the exposed substrate by atomic layer deposition. The substrate is selected or may be selected from the group consisting of silicon dioxide, methyl silsesquioxane, hydrogen silsesquioxane, low dielectric constant materials, and high dielectric constant oxide substrates.

The plasma is or may be an oxygen plasma, and may be generated by passing molecular oxygen through a plasma generation source to produce activated radicals to thereby generate a large number of nucleation sites on the substrate. The plasma may also be a nitrogen and may be generated by passing molecular nitrogen through a plasma generation source to produce activated radicals to thereby generate a large number of nucleation sites on the substrate.

The atomic layer deposition may be performed by alternating steps of exposing the substrate to a ruthenium precursor for a first predetermined period of time; and exposing the substrate to a plasma for a second predetermined time. The method further comprising evacuating the ruthenium precursor and the plasma between successive steps.

The ruthenium precursor is selected or may be selected from the group consisting of:

ruthenium cyclopentadienyl, bis(ethylcyclopentadinyl))ruthenium); and ((2,4-dimethylpentadienyl)ethylcyclopentadienyl) ruthenium). The ruthenium precursor is carried in a carrier gas, preferably inert, such as argon.

The substrate may be heated to a temperature of between 200 and 400° C., and preferably, 350° C.

Using this method the ruthenium is deposited directly on the substrate without use of a seed layer.

In accordance with another aspect of the invention, a method for depositing ruthenium on a substrate, comprises performing plasma enhanced atomic layer deposition of ruthenium on the substrate using a ruthenium precursor and a plasma to form a thin film of ruthenium; and depositing ruthenium on the thin film by thermal atomic layer deposition. The plasma is preferably a hydrogen plasma. As set forth above, the atomic layer deposition is performed by alternating steps of exposing the substrate to a ruthenium precursor for a first predetermined period of time; and exposing the substrate to a plasma for a second predetermined time. The process may employ the parameters and conditions set forth in detail above.

In accordance with yet another aspect of the invention, a ruthenium film formed by atomic layer deposition comprises less than three percent oxygen and less than 2% carbon. The film may be configured as a gate of a CMOS device. The film may be deposited on a silicon dioxide substrate. The ruthenium film may be deposited directly on a substrate without use of a seed layer. The film may serve as a plating layer for a copper interconnect.

BRIEF DESCRIPTION OF THE DRAWINGS

These and other aspects, features, and advantages of the present invention will become apparent upon further consideration of the following detailed description of the invention when read in conjunction with the drawing figures, in which.

DESCRIPTION OF THE INVENTION

Figure 1A:
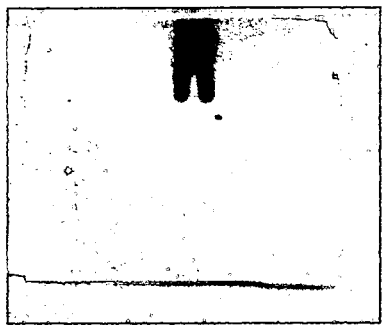
FIG. 1A illustrates deposited ruthenium on $SiO_2$ without any treatment showing macrosize defects.

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

An apparatus which may be used to perform the method in accordance with the invention is described in the above mentioned paper entitled Plasma-Enhanced Atomic Layer Deposition of Ta and Ti For Interconnect Diffusion Barriers by S. M. Rossnagel, J. Vac. Sci. Technol. B18(4), July/August 2000. The teachings of this paper are incorporated herein by reference in their entirety.

Such noncommercial or a commercial atomic layer deposition (ALD) chamber can be used. Sample sizes as large as 200 mm diameter can be loaded and the chamber can be pumped by a reactive-gas grade turbo molecular pump with a working base pressure of $10^{-7}$ Torr. The sample heating can be done using a ceramic resistive heating plate, providing growth temperatures up to 450° C., with the processes typically running at 350° C. The temperature can be controlled by varying current to the heater, which can be previously calibrated against a thermocouple attached to the sample. Solid $Ru(Cp)_2$ (powder) contained in a glass tube can be used as the metal precursor. Other metal organic Ru precursors including $Ru(EtCp)_2$(bis(ethylcyclopentadinyl)) ruthenium) or $Ru(OD)_3$((2,4-dimethylpentadienyl) (ethylcyclopentadienyl)ruthenium) (also known as DER) can be used for the same purpose. The glass tube is maintained at 80° C. to develop adequate vapor pressure and all the delivery lines are heated to between 90–110° C. to prohibit condensation of the precursor. To improve the delivery, argon is used as a carrier gas and the flow is controlled by a mass flow controller upstream from the source tube.

The RF plasma source, which includes a quartz tube wrapped with a copper coil, can be used to produce plasma. Oxygen, nitrogen, and hydrogen flows are controlled by a leak valve or mass flow controller (MFC).

The deposition cycle includes the following steps: exposing the substrate to greater than 1,000 Langmuirs (a measure of the net flux of gas atoms that impact a unit area) of $Ru(Cp)_2$ carried by argon gas, evacuating the chamber, opening the gate valve for the RF source and the gas valve for hydrogen for PE-ALD of ruthenium or the oxygen valve for thermal ALD of ruthenium, and shutting off the valves for evacuation. No purging gas is used between $Ru(Cp)_2$ and oxygen (or atomic H) exposure, but using a purging gas does not change the result. The films are deposited on 5000 Å $SiO_2$ thermally grown on Si substrates. However, the invention is not limited to a $SiO_2$ substrate, but includes various other dielectric materials including SiCO, MSQ (methyl silsesquioxane), and HSQ (hydrogen silsesquioxane) and other low k materials, and high k oxide substrates (those having a dielectric constant of greater than 4.0, which is the dielectric constant of $SiO_2$). The film composition and thickness can be determined by Rutherford backscattering spectrometry (RBS). The microstructures are analyzed using X-ray diffraction (XRD) and morphology and roughness by atomic force microscopy (AFM).

The typical growth procedure includes 4 seconds of $Ru(Cp)_2$ exposure at 4 sccm of flow rate, 2 seconds of pump out, 2 seconds of $O_2$ flow at 30 sccm, and 2 seconds of pumping out. However, these conditions are provided only by way of example and the invention is not be limited to these specific process time. The growth temperature is typically 350° C., but growth temperatures of 200–400° C. are also useful. Further, ALD ruthenium can be deposited at different flow rate of precursors. At oxygen flow rate higher than 40 sccm, the deposited ruthenium film has a quite rough, milky surface. However, at low flow rate, a mirror like smooth surface is obtained.

The thermal ALD of ruthenium on $SiO_2$ shows that deposition did not occur everywhere on the substrates and macrosize defects may be seen as in FIG. 1a. This is evidence of the poor nucleation of ALD ruthenium on $SiO_2$ surfaces. RBS has shown that the carbon content is below the detection limit of RBS (typically below 2%), and oxygen content is very low; typically below 3%. The deposition rate is 1–1.1 A/cycle and the resistivity is 14–16 μΩcm.

EXAMPLE

Figure 1B:
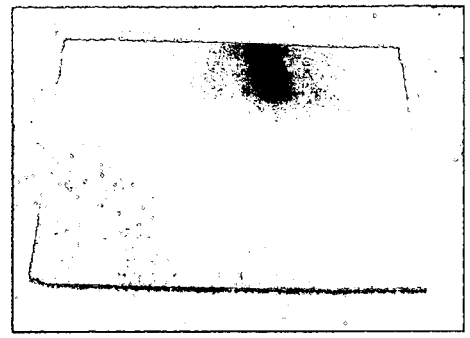
FIG. 1B illustrates deposited ruthenium with oxygen plasma treatment showing defect free thin film deposition.

To deposit nucleation problem free ALD ruthenium on $SiO_2$, the substrates are exposed to the plasma prior to the ALD of ruthenium for 10 minutes at the deposition temperature. Nitrogen, oxygen and hydrogen plasma may be used at 500 Watts of plasma power. In general, hydrogen plasma exposure does not, in and of itself, produce any significant improvement in terms of producing a uniform layer. However, oxygen plasma exposed $SiO_2$ produces very uniform, clean looking deposition on the substrates. Eight inch (20.3 cm) $SiO_2$ wafers are used for measurements of uniformity. In terms of sheet resistance, the uniformity of the deposited ruthenium films exhibits less than 5% variation in sheet resistance, without any bare surface spots. Similar improvement is also obtained by nitrogen exposure for 10 minutes on $SiO_2$ substrates. The clean, macroscopic defect free ruthenium metal films deposited by ALD is shown in FIG. 1b.

Comparison Example

PE-ALD using $Ru(Cp)_2$ and hydrogen plasma is attempted under the same deposition conditions, as above. The deposited ruthenium layer thickness is very small, and the sheet resistance is immeasurable (typically having a value greater than 1 $\Omega$cm) even for 500 process cycles, thus indicating that any atomic hydrogen which may be present does not effectively react with $Ru(Cp)_2$ adsorbed on the $SiO_2$ from the previous cycles. On the other hand, it appears that molecular oxygen oxidatively dissociates the ligands of metal precursors, producing a thin film by ALD. However, the subsequent thermal ALD of ruthenium on a 100 cycle deposition of this very thin ruthenium PE-ALD film on $SiO_2$ shows uniform ruthenium deposition, which is confirmed by electrical, sheet resistance measurements. Thus, the PE-ALD ruthenium provides a very thin ruthenium layer for enabling uniform deposition of ruthenium film by thermal ALD on this very thin layer.

Figure 2:
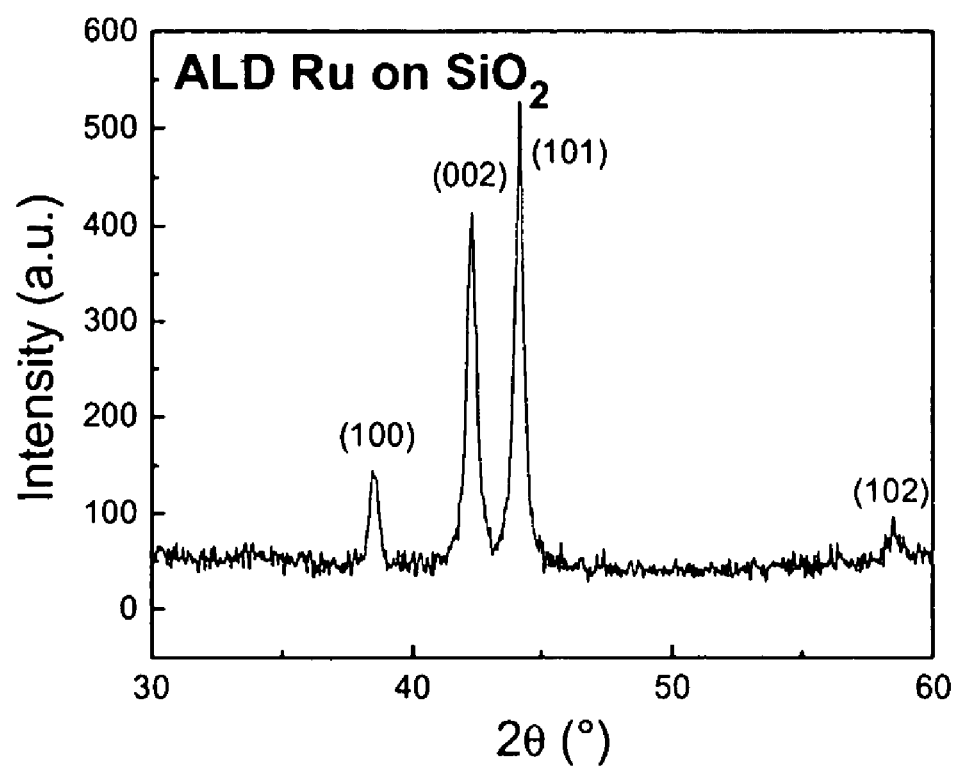
FIG. 2. illustrates x-ray diffraction data of ruthenium thermal ALD films with a PE-ALD ruthenium layer.

FIG. 2 shows the x-ray diffraction spectra of thin ruthenium films deposited by thermal ALD for 300 cycles on the 100 cycle deposit of ruthenium by the PE-ALD process. The x-ray diffraction spectra shows that the deposited film is hexagonal ruthenium metal film without any peaks related to ruthenium oxide ($RuO_2$).

Figure 3:
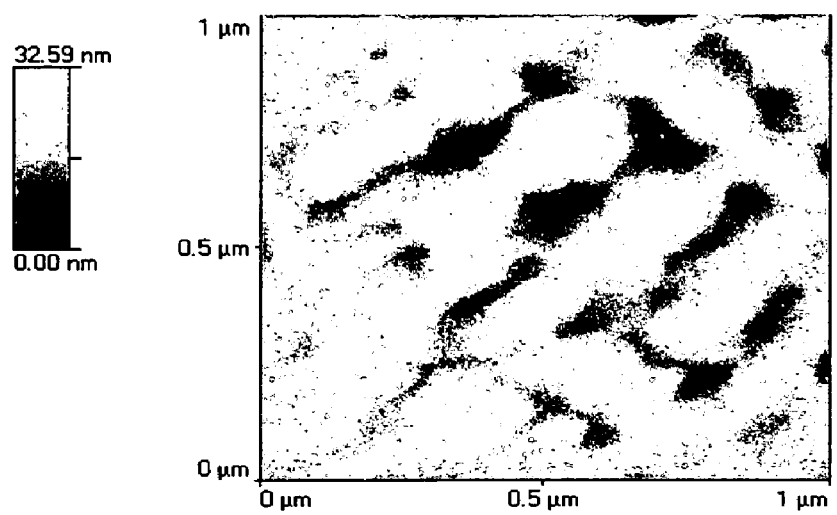
FIG. 3. is an atomic force microscope image of a ruthenium thermal ALD layer with PE-ALD Ru layer on SiO2.

FIG. 3 shows the results of atomic force microscope measurements of the thermal ALD ruthenium film deposited on the PE-ALD ruthenium layer. There is no evidence of defects, indicating that the entire surface is covered by ruthenium metal film evenly, as aided by the presence of the PE-ALD ruthenium underlayer.

Using this method, nucleation layer free ruthenium films are deposited on dielectric surfaces, thus having application as a direct plating layer for copper interconnects. The PVD seed layer deposition of ruthenium prior to ruthenium ALD cannot be implemented for semiconductor devices with nanoscale via size, due to the limited conformality of the PVD process. However, by using the present invention, a thin conformal layer of ruthenium is deposited inside of the vias and trenches formed on various dielectrics. Copper electrodeposition can be performed evenly on these ruthenium layers.

Direct deposition of ruthenium by ALD also is essential for the fabrication of dual work function metal gate CMOS devices. Ruthenium is one of the few metals having the proper work function for p-FET devices and the deposition of ruthenium directly on gate oxide is very important. In this case the use of a ruthenium PVD seed layer is hardly useful due to possible damage by the PVD process. The use of other materials as a nucleation aiding layer cannot be considered for this purpose.

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

Having thus described our invention, what we claim as new and desire to secure by Letters Patent is as follows:

1. A method for depositing ruthenium on a substrate, comprising:
   exposing the substrate to a plasma which causes a high concentration of nucleation sites to be formed on the substrate, thus forming an exposed substrate; and
   depositing ruthenium on the exposed substrate by atomic layer deposition;
   wherein said atomic layer deposition is performed by alternating steps of:
   exposing the substrate to a ruthenium precursor for a first predetermined period of time of four seconds; and
   exposing the substrate to a plasma for a second predetermined time.

2. The method of claim 1, wherein the substrate is selected from the group consisting of silicon dioxide, methyl silsesquioxane, hydrogen silsesquioxane, other low dielectric constant materials, and high dielectric constant oxide substrates.

3. The method of claim 1, wherein said plasma is an oxygen plasma.

4. The method of claim 3, wherein the oxygen plasma is generated by passing molecular oxygen through a plasma generation source to produce activated radicals to thereby generate a large number of nucleation sites on said substrate.

5. The method of claim 1, wherein said plasma is a nitrogen plasma.

6. The method of claim 5, wherein the nitrogen plasma is generated by passing molecular nitrogen through a plasma generation source to produce activated radicals to thereby generate a large number of nucleation sites on said substrate.

7. The method of claim 1, further comprising evacuating the ruthenium precursor and the plasma between successive steps.

8. The method of claim 7, wherein the evacuating is done for a period of two seconds.

9. The method of claim 1, wherein the ruthenium precursor is selected from the group consisting of:
   ruthenium cyclopentadienyl,
   bis(ethylcyclopentadinyl)) ruthenium); and
   ((2,4-dimethylpentadienyl)ethylcyclopentadienyl) ruthenium).

10. The method of claim 1, wherein the ruthenium precursor is carried in a carrier gas.

11. The method of claim 10, wherein the carrier gas is argon.

12. The method of claim 1, wherein said second predetermined period of time is 2 seconds.

13. The method of claim 1, wherein said exposing of said substrate to said plasma is performed for 10 minutes or longer.

14. The method of claim 1, wherein said substrate is heated to a temperature of between 200 and 400° C.

15. The method of claim 1, wherein said substrate is heated to a temperature of 350° C.

16. The method of claim 1, wherein said ruthenium is deposited directly on said substrate without use of a seed layer.

17. A method for depositing ruthenium on a substrate, comprising:
performing plasma enhanced atomic layer deposition of ruthenium on the substrate using a ruthenium precursor and a plasma to form a thin film of ruthenium; and
depositing ruthenium on the thin film by thermal atomic layer deposition;
wherein said atomic layer deposition is performed by alternating steps of:
exposing the substrate to a ruthenium precursor for a first predetermined period of time of four seconds; and
exposing the substrate to a plasma for a second predetermined time.

18. The method of claim 17, wherein said plasma is a hydrogen plasma.

19. The method of claim 17, further comprising evacuating the ruthenium precursor and the plasma between successive steps.

20. The method of claim 19, wherein the evacuating is done for a period of two seconds.

21. The method of claim 17, wherein the ruthenium precursor is selected from the group consisting of:
ruthenium cyclopentadienyl,
bis(ethylcyclopentadinyl)) ruthenium); and
((2,4-dimethylpentadienyl)ethylcyclopentadienyl) ruthenium).

22. The method of claim 17, wherein the ruthenium precursor is carried in a carrier gas.

23. The method of claim 22, wherein the carrier gas is argon.

24. The method of claim 17, wherein said second predetermined period of time is 2 seconds.

25. The method of claim 17, wherein said substrate is heated to a temperature of between 200 and 400° C.

26. The method of claim 17, wherein said substrate is heated to a temperature of 350° C.

27. A ruthenium film formed by the method of claim 1, comprising less than three percent oxygen and less than 2% carbon.

28. The ruthenium film of claim 27, configured as a gate of a CMOS device.

29. The ruthenium film of claim 27, deposited on a silicon dioxide substrate.

30. The ruthenium film of claim 27, deposited directly on a substrate without use of a seed layer.

31. The ruthenium film of claim 27, for serving as a plating layer for a copper interconnect.

32. A method for depositing ruthenium on a substrate, comprising:
exposing the substrate to an atomic hydrogen plasma which causes a high concentration of nucleation sites to be formed on the substrate, thus forming an exposed substrate; and
depositing ruthenium on the exposed substrate by atomic layer deposition;
wherein said atomic layer deposition is performed by alternating steps of:
exposing the substrate to a ruthenium precursor for a first predetermined period of time; and
exposing the substrate to molecular oxygen for a second predetermined time.

33. The method of claim 32, wherein a nucleation aiding layer is formed by using a ruthenium metal organic precursor and said atomic hydrogen plasma.

34. A ruthenium film formed by the method of claim 33, comprising less than three percent oxygen and less than 2% carbon.

35. The ruthenium film of claim 34, deposited on a silicon dioxide substrate.

* * * * *